United States Patent
Hamaya et al.

(10) Patent No.: US 9,217,937 B2
(45) Date of Patent: Dec. 22, 2015

(54) INTERFEROMETRIC MEASUREMENT OF ROTATION OF STAGE APPARATUS AND ADJUSTMENT METHOD THEREOF, EXPOSURE APPARATUS AND METHOD OF MANUFACTURING DEVICE

(71) Applicant: CANON KABUSHIKI KAISHA, Tokyo (JP)

(72) Inventors: Zenichi Hamaya, Utsunomiya (JP); Keiji Emoto, Saitama (JP); Ryo Takai, Utsunomiya (JP); Shinichiro Hirai, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 232 days.

(21) Appl. No.: 14/065,681

(22) Filed: Oct. 29, 2013

(65) Prior Publication Data

US 2014/0125962 A1 May 8, 2014

(30) Foreign Application Priority Data

Nov. 8, 2012 (JP) .................................. 2012-246663

(51) Int. Cl.
*G01B 9/02* (2006.01)
*G03F 9/00* (2006.01)

(52) U.S. Cl.
CPC .......... *G03F 9/7049* (2013.01); *G01B 9/02019* (2013.01)

(58) Field of Classification Search
CPC .................................................. G01B 9/02019
See application file for complete search history.

(56) References Cited

FOREIGN PATENT DOCUMENTS

JP 10-261570 A 9/1998

*Primary Examiner* — Peter B Kim
*Assistant Examiner* — Michelle Iacoletti
(74) *Attorney, Agent, or Firm* — Rossi, Kimms & McDowell LLP

(57) ABSTRACT

A stage apparatus includes a stage, an interferometric measurement device which is arranged to be able to measure a position of a surface of a mirror arranged on a side surface of the stage, and a driving unit configured to position the stage based on a measurement result of the interferometric measurement device. The interferometric measurement device includes: a varying unit configured to periodically vary an incident position where measurement light is incident on the mirror; and a detecting unit configured to detect rotation of the mirror based on a variation amount of the measurement result of the interferometric measurement device, which is generated upon a periodic variation of the incident position.

15 Claims, 10 Drawing Sheets

F I G. 4
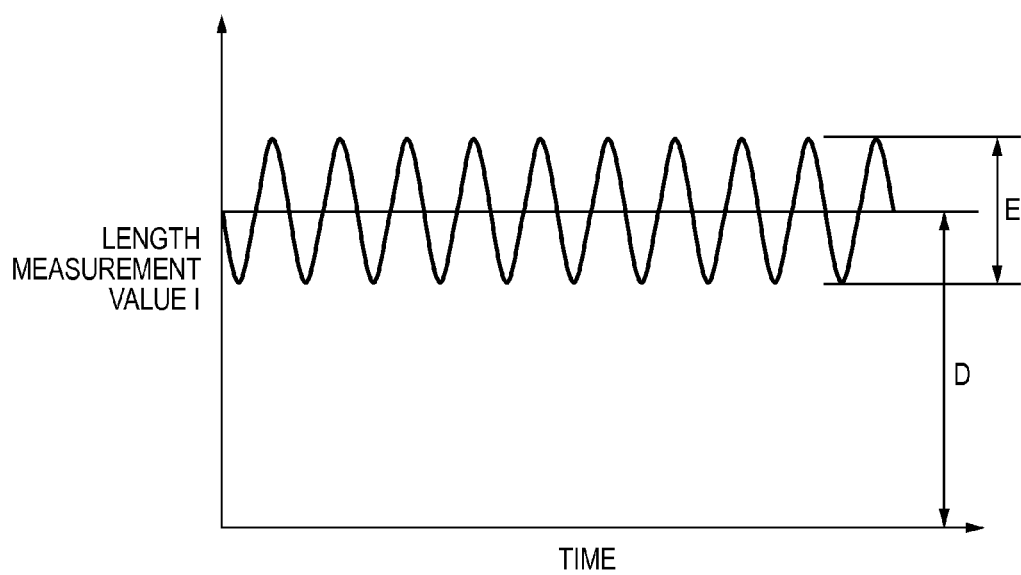

INTERFEROMETRIC MEASUREMENT OF ROTATION OF STAGE APPARATUS AND ADJUSTMENT METHOD THEREOF, EXPOSURE APPARATUS AND METHOD OF MANUFACTURING DEVICE

BACKGROUND OF THE INVENTION

1. Field of the Invention

The present invention relates to a stage apparatus and adjustment method thereof, an exposure apparatus, and a method of manufacturing a device.

2. Description of the Related Art

Japanese Patent Laid-Open No. 10-261570 discloses a stage apparatus of the prior art, in which an angle detection mechanism is provided to an X interferometer of a laser interferometer as a measurement example of an angle ($\omega Z$) about a Z axis of a stage. With this apparatus, X measurement light irradiated from the X interferometer is reflected by an X bar mirror of a fine moving stage of the stage, is split by a beam splitter, and is then incident on the angle detection mechanism. The angle detection mechanism detects a deviation of the X measurement light, thereby calculating a relative change in angle ($\omega Z$) about the Z axis of the fine moving stage.

As shown in FIG. 9, at an activation timing of a stage apparatus, a position of a stage 100 is initialized. The stage 100 includes a fine moving stage 101 and coarse moving stage 102. Upon initialization of the position of the stage 100, a reference required to position the stage is calculated. The coarse moving stage 102 is pressed against three positioning pins 104 arranged on a stage base 103. In this state, a position of an X bar mirror 110 of the fine moving stage 101 is measured using X measurement light 107 of an X interferometer 106 of a laser interferometer 105. Also, a position of a Y bar mirror 111 is measured using Y measurement light 109 of a Y interferometer 108. Furthermore, initializing units 112 and 113 reset length measurement values of the X interferometer 106 and Y interferometer 108, thus calculating a reference. The positioning pins 104 are designed to set an absolute angle $\omega Z$ of the fine moving stage 101 with respect to a reference coordinate system to be zero when the coarse moving stage 102 is pressed against these pins.

However, with this method, it is not guaranteed that the positioning pins 104 are adjusted to set the absolute angle $\omega Z$ of the fine moving stage 101 to be zero with sufficiently high precision. Even when the positioning pins 104 are adjusted, a deviation occurs depending on the pressing method of the coarse moving stage 102 in the initialization method of pressing the coarse moving stage against the positioning pins, and the absolute angle $\omega Z$ of the fine moving stage 101 may not be set to be zero at sufficiently high precision. Furthermore, the positioning pins 104 may be worn due to aging. Even when the coarse moving stage 102 is pressed against the positioning pins 104 without any deviation, the fine moving stage 101 may already have an inclination in that state. As described above, even after the aforementioned initialization operation, an angle $\theta XS_Z$ made by the X measurement light 107 and X bar mirror 110 in the laser interferometer 105 and an angle $\theta YS_Z$ made by the Y measurement light 109 and Y bar mirror 111 in a laser interferometer 105 may not be 90° with sufficiently high precision. The laser interferometers 105 of the conventional stage apparatus can measure a relative change in angle $\omega Z$ of the fine moving stage 101 with respect to the stage initial state. However, the angle $\theta XS_Z$ made by the X measurement light 107 and X bar mirror 110 and the angle $\theta YS_Z$ made by the Y measurement light 109 and Y bar mirror 111 in the laser interferometers 105 cannot be detected.

In this state, when emergence angles of laser beams or the X measurement light 107 and Y measurement light 109 of the laser interferometers 105 have changed, length measurement errors occur in the laser interferometers 105. FIG. 10 shows a length measurement error of the laser interferometer 105 when the X measurement light 107 and X bar mirror 110 are not orthogonal to each other about the Z axis. Assume that an emergence angle of a laser beam 115 has changed at a laser emergence port of a laser light source 114. Let L be a distance from the laser light source 114 to the X bar mirror 110, and $\theta S_Z$ be an angle in a counterclockwise direction from the X measurement light 107, which is made by the X measurement light 107 and X bar mirror 110. Let $\Delta\theta L1$ be a change amount, in a counterclockwise direction from the laser beam 115, of the emergence angle of the laser beam 115 about the Z axis, and $\Delta\theta L2$ be a change amount in a clockwise direction. At this time, a length measurement error E of the X interferometer 106 is expressed by:

$$E=E_{\Delta\theta L}1+E_{\Delta\theta L}2=L\times\tan(\Delta\theta L1+\Delta\theta L2)\times\tan|\theta S_Z-\pi/2| \quad (1)$$

where $\Delta\theta L1$, $\Delta\theta L2$, and ($\theta S_Z-\pi/2$) are angles around zero. Therefore, the length measurement error E of the X interferometer is approximated by:

$$E=L\times(\Delta\theta L1+\Delta\theta L2)\times|\theta S_Z-\pi/2| \quad (1')$$

If L=1 m, $\theta S_Z$=(5×e−4+π/2) rad, and $\Delta\theta L1+\Delta\theta L2$=5e−6 rad in equation (1'), the length measurement error E=2.5 nm, and poses a problem in positioning of the stage apparatus which is required to have a nano order resolution.

A change in laser emergence angle is caused by a time change in local temperature distribution in an optical path (common path) extending from the laser light source 114 to the X interferometer 106 in the laser interferometer 105 and vibrations of optical members such as the laser light source 114 and a beam splitter. Especially, although a heat generating member such as the laser light source 114 is arranged around the common path, positive temperature management is not often made unlike in a measurement space of the position of the fine moving stage 101. For this reason, a time change in temperature distribution readily takes place around the common path, and a change in emergence angle of the laser beam 115 is more likely to occur due to refraction of light.

SUMMARY OF THE INVENTION

The present invention provides a stage apparatus which can measure rotation of a stage at high precision.

The present invention in its one aspect provides a stage apparatus comprising a stage, an interferometric measurement device which is arranged to be able to measure a position of a surface of a mirror arranged on a side surface of the stage, and a driving unit configured to position the stage based on a measurement result of the interferometric measurement device, wherein the interferometric measurement device comprises: a varying unit configured to periodically vary an incident position where measurement light is incident on the mirror; and a detecting unit configured to detect rotation of the mirror based on a variation amount of the measurement result of the interferometric measurement device, which is generated upon a periodic variation of the incident position.

Further features of the present invention will become apparent from the following description of exemplary embodiments with reference to the attached drawings.

BRIEF DESCRIPTION OF THE DRAWINGS

FIG. 4 is a view showing the stage apparatus according to the first embodiment;

DESCRIPTION OF THE EMBODIMENTS

Embodiments of the present invention will be described in detail hereinafter with reference to the accompanying drawings.

First Embodiment

Figure 1:
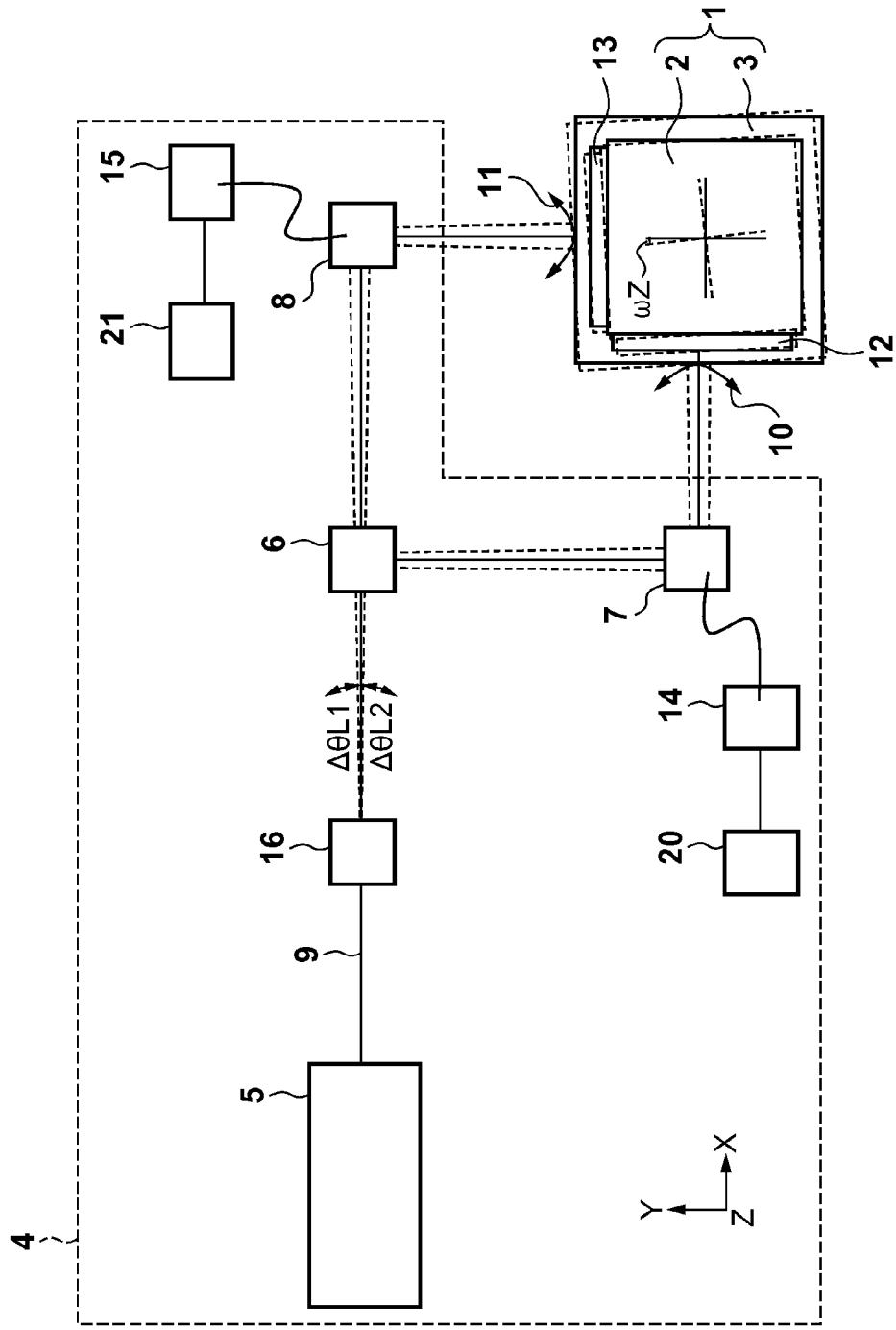
FIG. 1 is a view showing a stage apparatus according to the first embodiment.

FIGS. 1 to 5 show a stage apparatus according to the first embodiment of the present invention. As shown in FIG. 1, a stage 1 of the stage apparatus includes a fine moving stage 2 and coarse moving stage 3. The fine moving stage 2 is positioned while holding an object such as a wafer (substrate). The coarse moving stage 3 is moved by a long distance mainly in X-Y directions. In order to drive the coarse moving stage 3, a linear motor, planar motor, or the like is used. The fine moving stage 2 follows the coarse moving stage 3 via electromagnetic couplings and the like, and mainly makes fine movement in six axes (X, Y, Z, ωX, ωY, and ωZ). In order to drive the fine moving stage 2, a linear motor or the like is used.

A laser interferometer system (interferometric measurement device) 4 is arranged to be able to arrange positions of surfaces of mirrors arranged on the side surface of the fine moving stage 2. The laser interferometer system 4 includes a laser light source 5, beam splitter 6, X interferometer 7, and Y interferometer 8. A laser beam 9 emitted by the laser light source 5 is split by the beam splitter 6, and reaches the X interferometer 7 and Y interferometer 8. Each of the X interferometer 7 and Y interferometer 8 splits the laser beam into reference light and measurement light, and the reference light propagates toward a reference mirror (not shown) in the interferometer. X measurement light 10 and Y measurement light 11 respectively propagate toward an X bar mirror 12 and Y bar mirror 13 arranged on the fine moving stage 2. The X interferometer 7 measures a relative moving distance of the fine moving stage 2 in the X direction, and the Y interferometer 8 measures a relative moving distance of the fine moving stage 2 in the Y direction. The reference light reflected by each reference mirror and the measurement light reflected by each bar mirror are coupled again in each of the X interferometer 7 and Y interferometer 8, thus generating interfering light. By detecting an intensity change of this interfering light, a relative moving distance in the X or Y direction is measured. The X interferometer 7 and Y interferometer 8 respectively include detecting units 14 and 15 used to detect rotations of the X bar mirror 12 and Y bar mirror 13.

Figure 2:
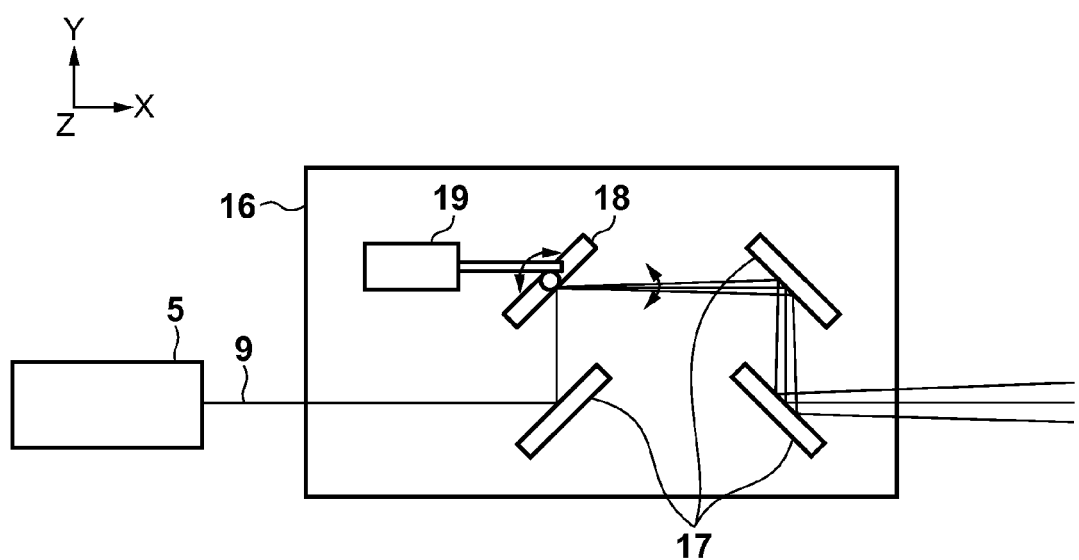
FIG. 2 is a view showing the stage apparatus according to the first embodiment.

The laser interferometer system 4 includes a varying unit 16 which periodically varies incidence positions of the laser beam 9 on the X bar mirror 12 and Y bar mirror 13 in an optical path between the laser light source 5 and the beam splitter 6 which splits the laser beam 9 to the X interferometer 7 and Y interferometer 8. An optical path between the laser light source 5 and X interferometer 7 or Y interferometer 8 is called a common path since the laser beam 9 is not split into reference light and measurement light. The varying unit 16 can be arranged at a place with a small spatial restriction. The varying unit 16 is arranged between, for example, the laser light source 5 and X interferometer 7 or Y interferometer 8, and between the laser light source 5 and beam splitter 6. FIG. 2 shows an example of the varying unit 16 which varies the incidence positions of the laser beam. The varying unit 16 shown in FIG. 2 includes three fixed mirrors 17, one variable angle mirror 18, and a piezo actuator 19. Coordinates of a Y-Z plane of a laser beam emerging from the varying unit 16 are set to match those of a Y-Z plane of a laser beam which is incident on the varying unit 16 when the variable angle mirror 18 is fixed. The angle of the variable angle mirror 18 at that time is an initial angle of the variable angle mirror 18. The varying unit 16 controls an angle about the Z axis of the laser beam 9 and a variation frequency of the angle. The piezo actuator 19 controls the angle about the Z axis of the variable angle mirror 18 to periodically vary the angle about the Z axis of the laser beam 9. The angle of the variable angle mirror 18 is varied with reference to the initial angle. The variation frequency of the angle of the laser 9 is also controlled under the control of the piezo actuator 19.

Figure 3:
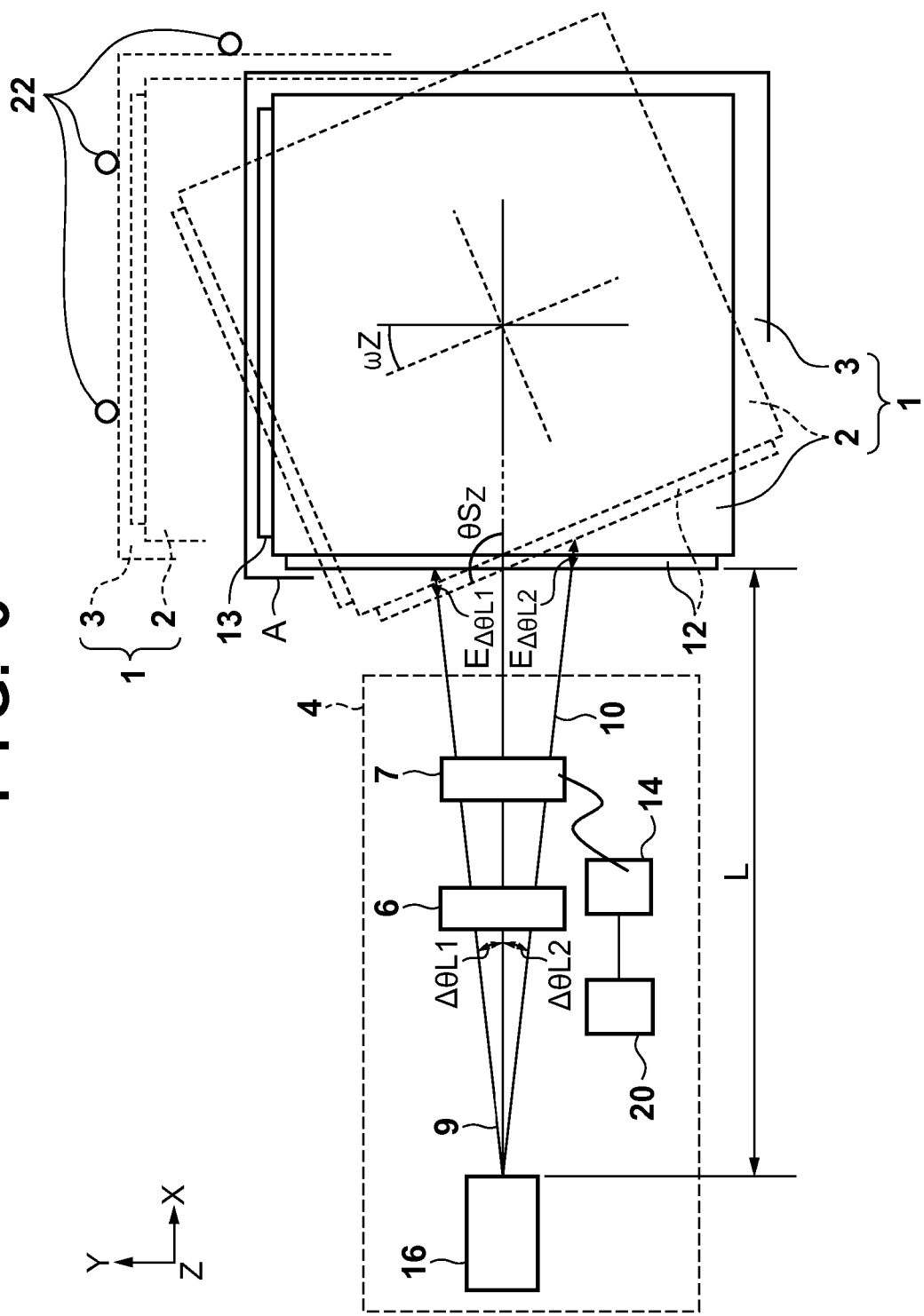
FIG. 3 is a view showing the stage apparatus according to the first embodiment.
Figure 5:
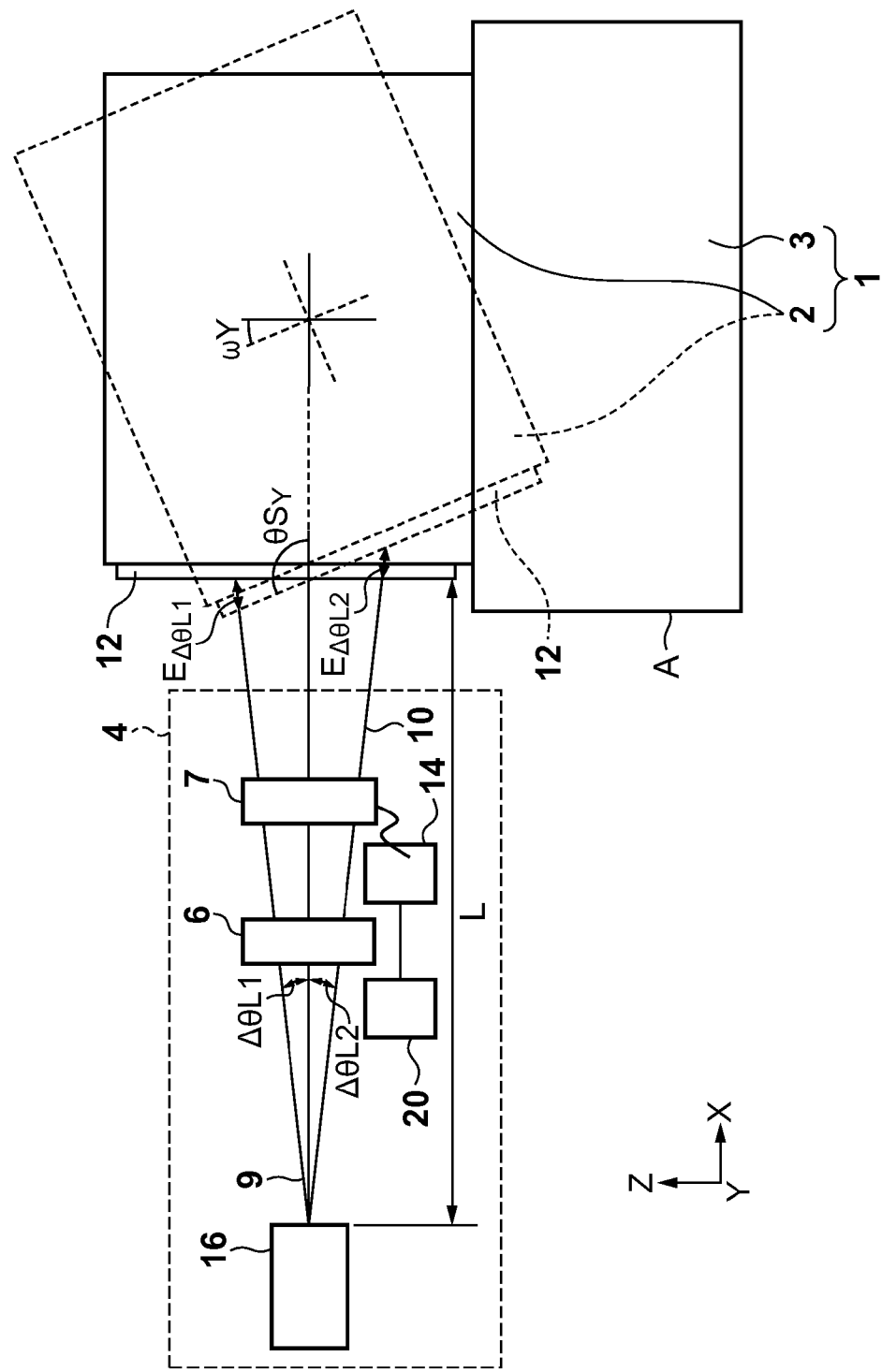
FIG. 5 is a view showing the stage apparatus according to the first embodiment.

The stage apparatus of the first embodiment includes initializing units 20 and 21, which initialize a position and orientation of the stage 1 at the activation timing of the apparatus. Initially, the fine moving stage 2 is fixed to the coarse moving stage 3 to complete initialization of the fine moving stage 2. Next, as shown in FIG. 3, the coarse moving stage 3 is pressed against three positioning pins 22 arranged on a stage base. In this state, the laser interferometer system 4 measures the position of the fine moving stage 2, and the initializing unit 20 resets a length measurement value of the X interferometer 7 to zero.

After initialization of the position and orientation of the stage 1, the stage 1 is moved to a position A separated from the positioning pins 22 while being set in a positioning control state, and is immobilized in a floating state. At the position A, the fine moving stage 2 does not interfere with the positioning pins 22 even when it is rotated at that position about the Z axis, and the laser interferometer system 4 can measure the position of the fine moving stage 2.

In a state in which the stage 1 remains still at the position A, the varying unit 16 periodically varies the angle about the Z axis of the laser beam 9. Letting $\Delta\theta L1$ be a variation amount of the angle in a counterclockwise direction from the laser beam 9 and $\Delta\theta L2$ be a variation amount of the angle in a clockwise direction, the angle to be varied is desirably about $\Delta\theta L1 = \Delta\theta L2 = 2.5$ μrad. A variation frequency f of the angle is set at a frequency f which exceeds a control band of a position control system of the stage 1, and at which the stage 1 in the positioning state does not follow and the control of the stage 1 is not influenced. When the control band of the stage 1 is 200 Hz, the frequency f can be set to be about 1 kHz about five times of the control band.

Assume that the rotation position of the fine moving stage 2 is deviated by an unknown angle ωZ about the Z axis, and the angle made by the X measurement light 10 and X bar mirror 12 is $\theta S_Z$ in the counterclockwise direction from the X measurement light. When the shape of the X bar mirror 12 is neither warped nor deformed, and the reflection surface of the X bar mirror 12 is parallel to the side surface of the fine moving stage 2, $\omega Z=\theta S_Z-\pi/2$. At this time, when the angle about the Z axis of the laser beam 9 is varied, and the X interferometer 7 measures the position of the fine moving stage 2, a length measurement error is generated in a length measurement value.

Letting $E_{\Delta\theta L}1$ be a length measurement error in case of the angle variation amount $\Delta\theta L1$, $E_{\Delta\theta L}2$ be a length measurement error in case of the angle variation amount $\Delta\theta L2$, and L be a distance from the varying unit 16 to the X bar mirror 12, a length measurement error E of the laser interferometer system 4 is expressed by:

$$E = E_{\Delta\theta L1} + E_{\Delta\theta L2} \qquad (2)$$
$$= 2 \times E_{\Delta\theta L1}$$
$$= 2 \times L \times \tan(\Delta\theta L1) \times \tan|\theta S_Z - \pi/2|$$

wherein the distance L indicates an optical path length of measurement light from the varying unit 16 to the X bar mirror 12.

Since both of $\Delta\theta L1$ and $(\theta S_Z-\pi/2)$ are angles around zero, the distance L from the varying unit 16 to the X bar mirror 12 can be approximated by:

$$E=2\times L\times\Delta\theta L1\times|\omega Z| \qquad (2')$$

According to the variation of the angle variation amount $\Delta\theta L1$ of the laser beam 9 using the frequency f, the measurement result of the X interferometer 7 and also the length measurement error E vary at the frequency f. FIG. 4 shows a time change in length measurement value I as the measurement result of the X interferometer 7. In the laser interferometer system 4, length measurement errors are caused by a change in refractive index of air on the measurement light, vibrations of the stage apparatus, and the like, but FIG. 4 shows only a length measurement error caused by an angle variation of the laser beam 9. In FIG. 4, an offset D is a moving distance of the stage from an initial position. The length measurement error E corresponds to an amplitude of the length measurement value I of the X interferometer 7 at the frequency f. In practice, only a signal synchronized with the frequency f can be extracted using a signal processing technique such as a bandpass filter. Alternatively, when frequency analysis such as FFT is applied to the length measurement value I of the X interferometer 7, the amplitude at the frequency f can be calculated. As described above, even when length measurement errors due to causes other than the angle variation of the laser beam have been generated in the length measurement value I, only the length measurement error caused by the angle variation of the laser beam can be extracted by focusing attention on the variation frequency f of the angle of the laser beam.

From equation (2'), the inclined angle $\omega Z$ about the Z axis of the fine moving stage 2 is expressed by:

$$|\omega Z|=E/(2\times L\times\Delta\theta L1) \qquad (3)$$

By calculating the amplitude E at the frequency f from the length measurement value I of the X interferometer 7 by the detecting unit 14, the inclined angle $|\omega Z|$ about the Z axis of the fine moving stage 2 can be calculated. The positive/negative sign of $\omega Z$ can be judged from the relationship between the angle of the laser beam and length measurement error. For example, if the length measurement error E is decreased when the angle about the Z axis of the laser beam 9 is changed in the counterclockwise direction from the laser beam 9, the inclination about the Z axis of the fine moving stage 2 is positive, that is, it is a counterclockwise inclination.

By rotating the fine moving stage 2 about the Z axis by an angle $-|E/(2\times L\times\Delta\theta L1)|$, the X measurement light 10 and X bar mirror 12 can be set to be orthogonal to each other about the Z axis. The initializing unit 20 resets angle information about the Z axis of the fine moving stage 2 measured by the X interferometer 7 to zero.

In the stage apparatus, the emergence angle of the laser beam is often varied by a time change in local temperature distribution in the common path. At this time, when the stage is inclined with respect to the measurement light 10, a length measurement error with respect to the position of the stage is generated. In the first embodiment, the detecting unit 14 detects the inclined angle $\omega Z$ about the Z axis of the fine moving stage 2 to rotate the fine moving stage 2, so that the X measurement light 10 and X bar mirror 12 are set to be orthogonal to each other about the Z axis. Thus, a length measurement error caused by the variation of the emergence angle of the laser beam 9 can be prevented from being generated when the stage apparatus is used.

When the stage apparatus is used, the inclined angle $\omega Z$ about the Z axis of the fine moving stage 2 is finely adjusted. In this case, the fine moving stage 2 has a certain inclination from the state of $\omega Z=0$ according to the first embodiment. According to equation (2), as $|\omega Z|$ is smaller, the length measurement error E of the laser interferometer system 4 is reduced. If $\omega Z=0$ is set immediately after initialization of the stage 1 according to the first embodiment, an increment of $|\omega Z|$ caused by fine adjustment of the fine moving stage 2 is reduced. That is, according to the first embodiment, even when the fine moving stage 2 is finely adjusted when the stage is used, the length measurement error E of the laser interferometer system 4 is smaller than the case in which the first embodiment is not executed.

In the first embodiment, immediately after initialization of the stage 1, the detecting unit 14 calculates the inclined angle $\omega Z$ about the Z axis of the fine moving stage 2, and the fine moving stage 2 is rotated to attain $\omega Z=0$, thus resetting the angle information to zero. Simultaneously with the positioning control of the stage in translation directions (X- and Y-axis directions), $\omega Z$ may be calculated according to the first embodiment, and may be used in positioning control about a $\omega Z$ axis. Thus, using 2-axis interferometers, that is, the X interferometer 7 and Y interferometer 8, the positioning control of the fine moving stage 2 can be executed in association with three axes, that is, X, Y, and $\omega Z$ axes. In a representative method of the prior art, an interferometer for one axis is added to the X or Y axis, and each $\omega Z$ about the Z axis of the stage is calculated based on a difference from the interferometer output of the X or Y axis, thus executing the positioning control about the Z axis. In the first embodiment, in place of adding the interferometer, the varying unit 16 and detecting unit 14 are added to make it possible to increase the number of axes that can be measured.

The first embodiment has explained the measurement in the X direction of the fine moving stage 7 by the X interferometer 7. Also, the same applies to measurement in the Y direction of the fine moving stage 2 by the Y interferometer 8. The detecting unit 15 calculates an inclined angle $\omega Z$ about the Z axis of the fine moving stage 2 from a length measurement value of the Y interferometer 8 to rotate the fine moving stage 2, thus setting the Y measurement light 11 and Y bar mirror 13 to be orthogonal to each other about the Z axis.

In the first embodiment, the varying unit 16 varies the angle about the Z axis of the laser beam 9 in the counterclockwise and clockwise directions from the laser beam 9. However, the present invention is not limited to this, and the angle may be varied in, for example, only the counterclockwise direction from the laser beam 9. In this case as well, the detecting unit 14 calculates the inclined angle ωZ about the Z axis of the fine moving stage 2 to rotate the fine moving stage 2, thus setting the X measurement light 10 and X bar mirror 12 to be orthogonal to each other about the Z axis.

In place of the angle of the laser beam 9, the position of the laser beam 9 may be shifted in the Y direction. Letting $D_L$ be a shift amount in the Y direction of the laser beam 9, and L be a distance from the varying unit 16 to the X bar mirror 12, the length measurement error E of the laser interferometer system 4 in this case is expressed by:

$$E = D_L \times \tan|\theta S_Z - \pi/2| \quad (4)$$
$$= D_L \times |\omega Z|$$

The length measurement error E corresponds to the amplitude of the length measurement value I of the X interferometer 7 at the frequency f. By applying frequency analysis to the length measurement value I of the X interferometer 7 using a bandpass filter, FFT, or the like, the amplitude at the frequency f can be calculated.

From equation (4), the inclined angle ωZ about the Z axis of the fine moving stage 2 is expressed by:

$$|\omega Z| = E/D_L \quad (5)$$

By calculating the amplitude E at the frequency f from the length measurement value I of the X interferometer 7 by the detecting unit 14, the inclined angle |ωZ| about the Z axis of the fine moving stage 2 can be similarly calculated.

The first embodiment has explained the case in which the fine moving stage 2 is inclined at an unknown angle about the Z axis. Also, the first embodiment can be similarly applied to a case in which the fine moving stage 2 is inclined at an unknown angle about the X or Y axis. A case will be described below with reference to FIG. 5 wherein the fine moving stage 2 is inclined at an unknown angle about the Y axis. The varying unit 16 controls an angle about the Y axis of the laser beam 9 and a variation frequency of the angle. Letting ΔθL1 be an angle variation in the counterclockwise direction from the laser beam 9 and ΔθL2 be an angle variation amount in the clockwise direction, the angle to be varied is ΔθL1=ΔθL2. The variation frequency f of the laser angle is set at a frequency f at which the stage 1 in the positioning control state does not follow and the stage control is not influenced.

Assume that the fine moving stage 2 is inclined at an unknown angle about the Y axis, and an angle made by the X measurement light 10 and X bar mirror 12 is $\theta S_Y$ in the counterclockwise direction from the X measurement light 10. When the shape of the X bar mirror 12 is neither warped nor deformed, and the reflection surface of the X bar mirror 12 is parallel to the side surface of the fine moving stage 2, ωY=$\theta S_Y$−π/2. At this time, when the angle about the Y axis of the laser beam 9 is varied, and the X interferometer 7 measures the position of the fine moving stage 2, a length measurement error is generated in a length measurement value.

Letting L be a distance from the varying unit 16 to the Y bar mirror, the length measurement error E of the laser interferometer system 4 is approximated by:

$$E = 2 \times L \times \Delta\theta L1 \times |\omega Y| \quad (6)$$

The length measurement error E corresponds to the amplitude of the length measurement value I of the X interferometer 7 at the frequency f. By applying frequency analysis to the length measurement value I of the X interferometer 7 using a bandpass filter, FFT, or the like, the amplitude at the frequency f can be calculated.

From equation (6), the inclined angle ωY about the Y axis of the fine moving stage 2 is expressed by:

$$|\omega Y| = E/(2 \times L \times \Delta\theta L1) \quad (7)$$

By calculating the amplitude E at the frequency f from the length measurement value I of the X interferometer 7 by the detecting unit 14, the inclined angle |ωY| about the Y axis of the fine moving stage 2 can be calculated. The positive/negative sign of ωY can be judged from the relationship between the laser angle and length measurement error. For example, if the length measurement error E is decreased when the angle about the Y axis of the laser beam 9 is changed in the counterclockwise direction from the laser beam 9, the inclination about the Y axis of the fine moving stage 2 is positive, that is, it is a counterclockwise inclination.

By rotating the fine moving stage 2 about the Y axis by an angle −|E/(2×L×ΔθL1)|, the X measurement light 10 and X bar mirror 12 can be set to be orthogonal to each other about the Y axis. The initializing unit 20 resets angle information about the Y axis of the fine moving stage 2 measured by the X interferometer 7 to zero. Thus, when the stage apparatus is used, generation of a length measurement error caused by an unexpected variation of the emergence angle of the laser beam 9 about the Y axis can be prevented.

The first embodiment has explained the case in which the angles of the fine moving stage 2 are individually adjusted about the X, Y, and Z axes. Alternatively, the stage angles about a plurality of axes can be simultaneously calculated and adjusted. A case will be described below wherein angles the X measurement light 10 and X bar mirror 12 about the Y and Z axes are simultaneously adjusted. The varying unit 16 varies an angle about the Y axis of the laser beam 9 at a frequency fY and an angle about the Z axis at a frequency fZ. The varying unit 16 is configured to control the variable angle mirror 18 in a plurality of axes using different frequencies. Alternatively, two varying units 16 about the Y and Z axes may be arranged. Letting ΔθL1 be an angle variation in the counterclockwise direction from the laser beam 9 and ΔθL2 be an angle variation amount in the clockwise direction, the angle to be varied about both of the Y and Z axes is ΔθL1=ΔθL2.

Assume that the fine moving stage 2 is inclined respectively at unknown angles ωY and ωZ about the Y and Z axes, and angles about the Y and Z axes, which are made by the X measurement light 10 and X bar mirror 12, are respectively $\theta S_Y$ and $\theta S_Z$ in the counterclockwise direction from the X measurement light. When the shape of the X bar mirror 12 is neither warped nor deformed, and the reflection surface of the X bar mirror 12 is parallel to the side surface of the fine moving stage 2, ωY=$\theta S_Y$−π/2 and ωZ=$\theta S_Z$−π/2. At this time, when the angles about the Y and Z axes of the laser beam 9 are varied, and the X interferometer 7 measures the position of the fine moving stage 2, length measurement errors are generated in a length measurement value. Let $E_{fY}$ be a length measurement error about the Y axis of the laser beam 9, $E_{fZ}$ be a length measurement error about the Z axis, and L be a distance from the varying unit 16 to the X bar mirror 12. At this time, inclined angles ωY and ωZ about the Y and Z axes of the fine moving stage 2 are respectively expressed by:

$$|\omega Y| = E_{fY}/(2 \times L \times \Delta\theta L1) \quad (8)$$

$$|\omega Z| = E_{fZ}/(2 \times L \times \Delta\theta L1) \quad (9)$$

The length measurement errors $E_{fY}$ and $E_{fZ}$ respectively correspond to amplitudes of the length measurement value I of the X interferometer 7 at the frequencies fY and fZ. By applying frequency analysis to the length measurement value I of the X interferometer 7 using a bandpass filter, FFT, or the like, the amplitudes at the frequencies fY and fZ can be calculated. As described above, the detecting unit 14 can simultaneously detect the inclined angles |ωY| and |ωZ| about the Y and Z aces of the fine moving stage 2. The positive/negative signs of ωZ and ωY can be judged from the relationships between the laser angle and length measurement errors. By rotating the fine moving stage 2 about the Y axis by an angle $-|E_{fY}/(2 \times L \times \Delta\theta L1)|$, the X measurement light 10 and X bar mirror 12 can be set to be orthogonal to each other about the Y axis. Also, by rotating the fine moving stage 2 about the Z axis by an angle $-|E_{fZ}/(2 \times L \times \Delta\theta L1)|$, the X measurement light 10 and X bar mirror 12 can be set to be orthogonal to each other about the Z axis. The initializing unit 20 resets pieces of angle information about the Y and Z axes of the fine moving stage 2 measured by the X interferometer 7 to zero. Thus, when the stage apparatus used, generation of length measurement errors caused by unexpected variations of the emergence angles of the laser beam 9 about the Y and Z axes can be prevented.

Second Embodiment

Figure 6:
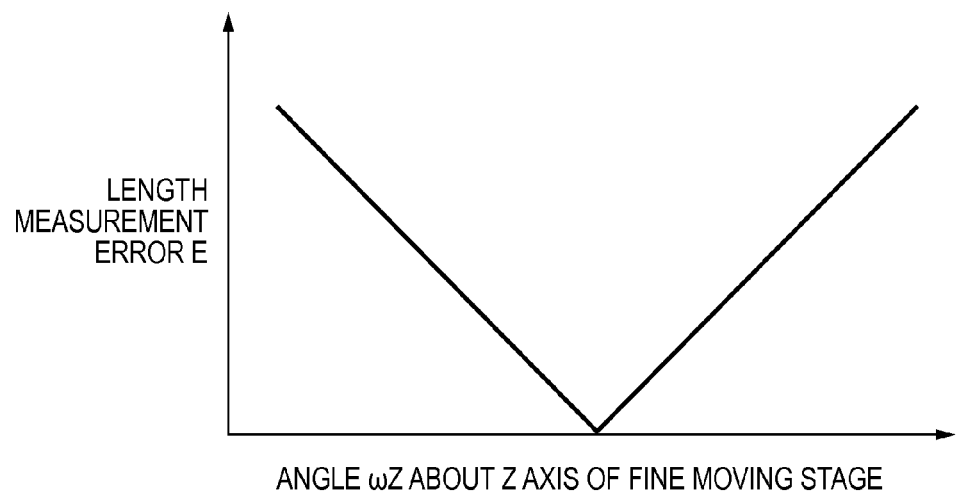
FIG. 6 is a view showing a stage apparatus according to the second embodiment.
Figure 7:
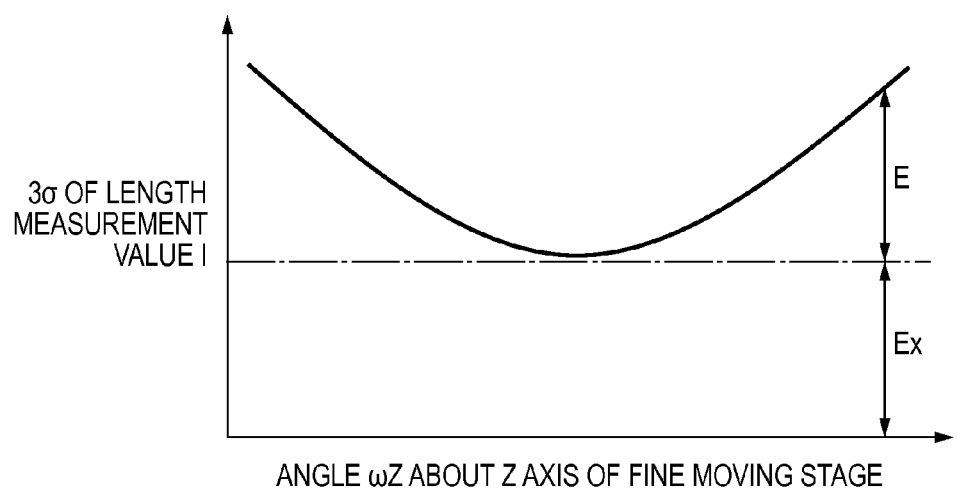
FIG. 7 is a view showing the stage apparatus according to the second embodiment.

A stage apparatus according to the second embodiment will be described below with reference to FIGS. 6 and 7. A difference from the first embodiment lies in that an inclined angle ωZ about the Z axis of a fine moving stage 2 is not directly calculated, and the orientation of the fine moving stage corresponding to ωZ=0 is determined from a change in length measurement error E or length measurement value I. In the stage apparatus of the second embodiment, as shown in FIG. 3, after initialization of the position of a stage 1, the stage 1 is moved to a position A spaced apart from positioning pins 22 while being set in a positioning control state, and is immobilized in a floating state. At the position A, the fine moving stage 2 does not interfere with the positioning pins 22 even when it is rotated at that position about the Z axis, and a laser interferometer system 4 can measure the position of the fine moving stage 2.

In a state in which the stage 1 remains still at the position A, a varying unit 16 varies the angle about the Z axis of a laser beam 9. Letting ΔθL1 be a variation amount of the angle in a counterclockwise direction from the laser beam 9 and ΔθL2 be a variation amount of the angle in a clockwise direction, the angle to be varied is, for example, about ΔθL1=ΔθL2=2.5 μrad. A variation frequency f of the laser angle is set at a frequency f at which the stage 1 in the positioning control state does not follow and the control of the stage 1 is not influenced. When a stage control band is 200 Hz, the frequency f can be set to be about 1 kHz about five times of the control band.

Assume that the rotation position of the fine moving stage 2 is deviated by an unknown angle about the Z axis, and an angle made by X measurement light 10 and an X bar mirror 12 is $\theta S_Z$ in the counterclockwise direction from the X measurement light 10, as shown in FIG. 3. When the shape of the X bar mirror 12 is neither warped nor deformed, and the reflection surface of the X bar mirror 12 is parallel to the side surface of the fine moving stage 2, $\omega Z = \theta S_Z - \pi/2$. At this time, when the angle about the Z axis of the laser beam 9 is varied, and the X interferometer 7 measures the position of the fine moving stage 2, a length measurement error is generated in a length measurement value.

Letting L be a distance from the varying unit 16 to the X bar mirror 12, a length measurement error E of the laser interferometer system 4 can be approximated by:

$$E = 2 \times L \times \Delta\theta L1 \times |\omega Z| \quad (10)$$

In this case, by gradually changing an angle ωZ about the Z axis of the fine moving stage 2 in addition to the angle of the laser beam 9, the length measurement error E changes. FIG. 6 shows the relationship between the length measurement error E and the angle ωZ about the Z axis of the fine moving stage 2. When the X measurement light 10 and X bar mirror 12 are orthogonal to each other, $\omega Z = \theta S_Z - \pi/2 = 0$, that is, the length measurement error E=0, and the length measurement error E assumes a minimal value with respect to a change in angle ωZ.

The length measurement error E corresponds to an amplitude of a length measurement value I of the X interferometer 7 at the frequency f. By applying frequency analysis to the length measurement value I of the X interferometer 7 using a bandpass filter, FFT, or the like, the amplitude at the frequency f can be calculated. By gradually changing the angle ωZ of the fine moving stage 2, the angle $\theta S_Z$ made by the X measurement light 10 and X bar mirror 12 is changed. When a detecting unit 14 calculates the length measurement error E, and rotation of the fine moving stage 2 is stopped at a position corresponding to a minimum length measurement error E, the angle $\omega Z = \theta S_Z - \pi/2 = 0$. At this time, the X measurement light 10 and X bar mirror 12 can be set to be orthogonal to each other. An initializing unit 20 resets angle information about the Z axis of the fine moving stage 2 measured by the X interferometer 7 to zero. Thus, when the stage apparatus is used, generation of a length measurement error caused by an unexpected variation of an emergence angle of the laser beam 9 about the Y axis can be prevented. In the aforementioned example, rotation of the fine moving stage 2 is stopped at a position corresponding to the minimum length measurement error E. Alternatively, rotation of the fine moving stage 2 may be stopped at a position where the length measurement error E falls within a threshold range.

In place of the length measurement error E, a standard deviation 3σ may be calculated, and the angle ωZ of the fine moving stage 2 may be changed to minimize the standard deviation 3σ of the length measurement value I. The standard deviation 3σ of the length measurement value I is expressed by a square root of a square sum of a standard deviation 3σ of the length measurement error E caused by the laser angle variation and a standard deviation 3σ of a length measurement error Ex caused by factors other than the laser angle variation. The length measurement error Ex caused by factors other than the laser angle variation includes a change in refractive index of air on the measurement light, vibrations of the stage apparatus, and the like. FIG. 7 shows the relationship between the standard deviation 3σ of the length measurement value I and the angle ωZ about the Z axis of the fine moving stage 2. Even when the length measurement error EX caused by factors other than the laser angle variation has occurred, the detecting unit 14 calculates the standard deviation 3σ of the length measurement value I, and rotation of the fine moving stage 2 is stopped at a position corresponding to the minimum standard deviation 3σ of the length measurement value I, thus minimizing the length measurement error E. At this time, the angle $\omega Z = \theta S_Z - \pi/2 = 0$, and the X measurement light 10 and X bar mirror 12 can be set to be orthogonal to each other. The initializing unit 20 resets angle information about the Z axis of the fine moving stage 2 measured by the X interferometer 7 to zero. Thus, when the stage apparatus is used, generation of a length measurement error caused by an unexpected variation of an emergence angle of the laser beam 9 about the Z axis can be prevented.

It is effective to calculate the standard deviation 3σ of the length measurement value I even when the variation angle and variation frequency of the laser angle are not controlled. For example, a heat source exists near the common path, and the angle of the laser beam 9 is varied at an unknown angle and frequency in some cases. In such case, the detecting unit 14 calculates the standard deviation 3σ of the length measurement value I to change the angle ωZ of the stage, and rotation of the fine moving stage 2 is stopped at a position corresponding to the minimum standard deviation 3σ of the length measurement value I. At this time, ωZ=θS$_Z$−π/2=0, and the X measurement light 10 and X bar mirror 12 can be set to be orthogonal to each other. The initializing unit 20 resets angle information about the Z axis of the fine moving stage 2 measured by the X interferometer 7 to zero. Thus, when the stage apparatus is used, generation of a length measurement error caused by an unexpected variation of an emergence angle of the laser beam 9 about the Z axis can be prevented.

Third Embodiment

A stage apparatus according to the third embodiment will be described below with reference to FIG. 8. A difference from the first and second embodiment lies in that the third embodiment can cope with a case in which a shape of an X bar mirror 12 is warped or deformed, and a reflection surface 21 of the X bar mirror 12 is not parallel to a side surface 22 of a fine moving stage 22. The stage apparatus according to the third embodiment initializes a position of a stage 1, as shown in FIG. 3. Next, the stage 1 is moved to a position A spaced apart from positioning pins 22, and is immobilized in a floating state. At the position A, a fine moving stage 2 does not interfere with the positioning pins 22 even when it is rotated at that position about the Z axis, and a laser interferometer system 4 can measure the position of the fine moving stage 2.

In a state in which the stage 1 remains still at the position A, a varying unit 16 varies the angle about the Z axis of a laser beam 9. Letting ΔθL1 be a variation amount of the angle in a counterclockwise direction from the laser beam 9 and ΔθL2 be a variation amount of the angle in a clockwise direction, the angle to be varied is, for example, about ΔθL1=ΔθL2=2.5 μrad. A variation frequency f of the laser angle is set at a frequency f at which the stage 1 in the positioning control state does not follow and the control of the stage 1 is not influenced. When a stage control band is 200 Hz, the frequency f can be set to be about 1 kHz about five times of the control band.

Figure 8:
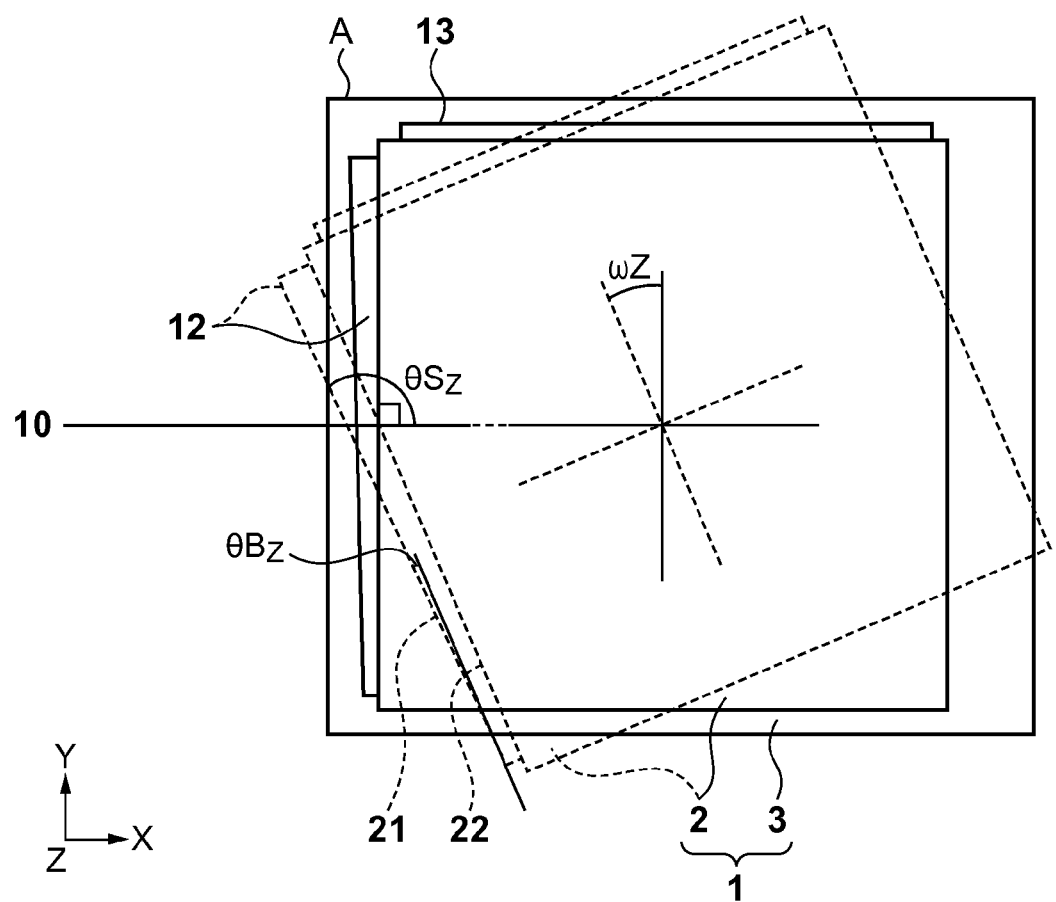
FIG. 8 is a view showing a stage apparatus according to the third embodiment.
Figure 9:
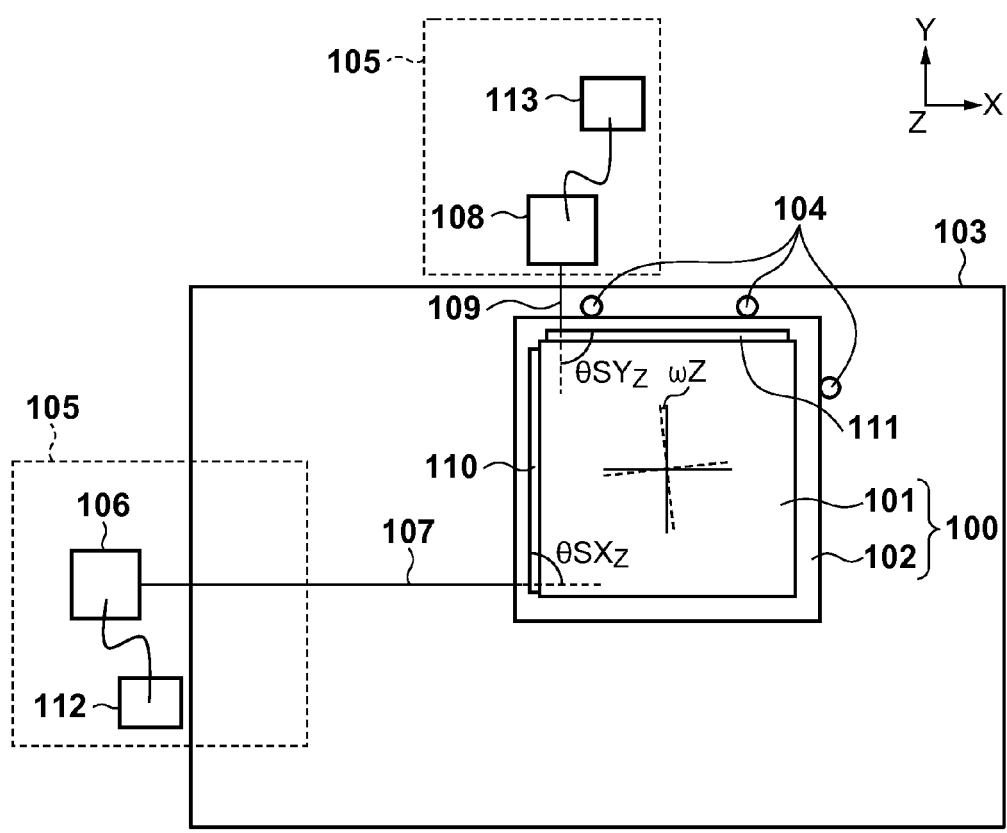
FIG. 9 is a view showing a conventional stage apparatus.
Figure 10:
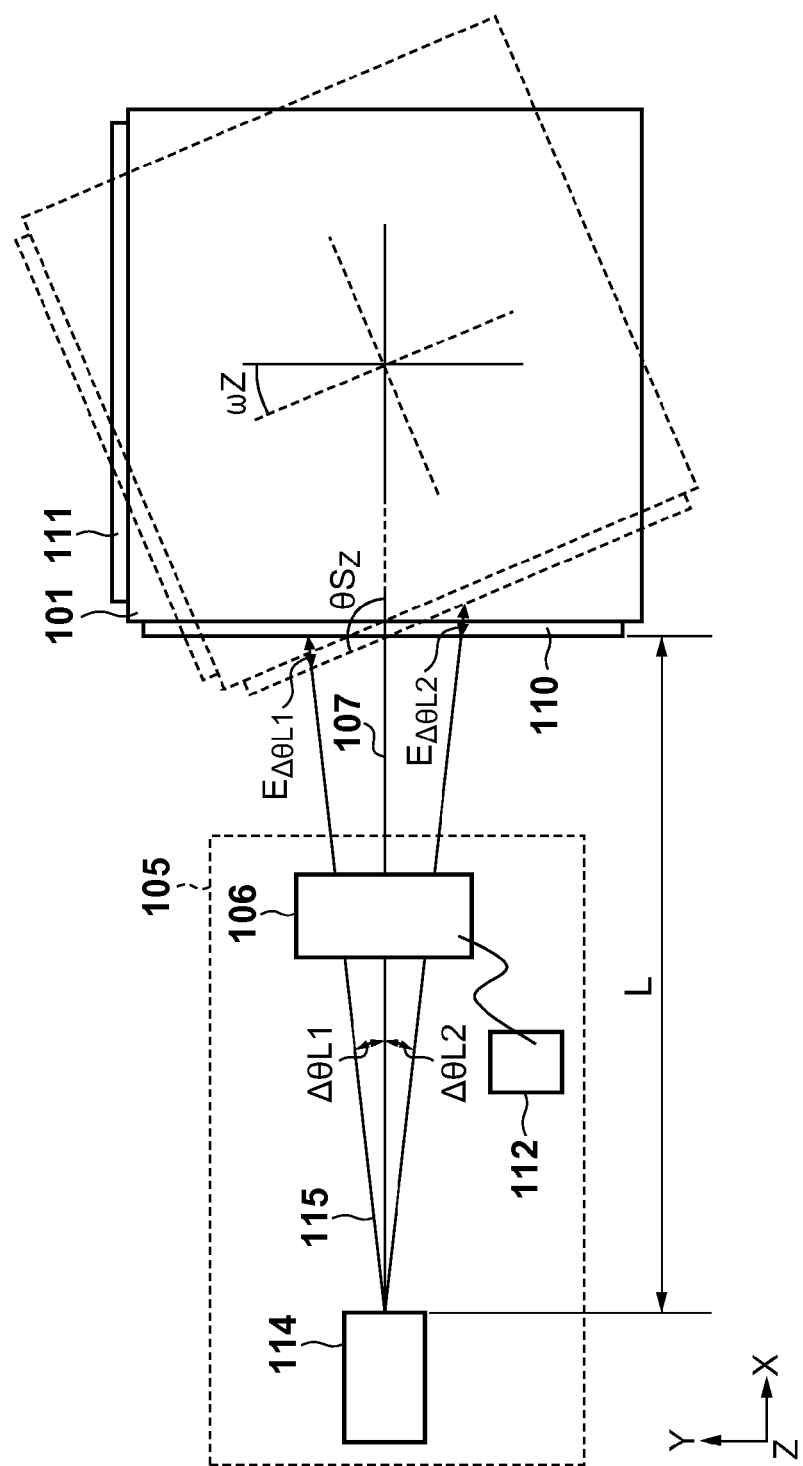
FIG. 10 is a view showing the conventional stage apparatus.

Assume that the shape of the X bar mirror 12 is warped or deformed, and an angle about the Z axis between the reflection surface 21 of the X bar mirror 12 and the side surface 22 of the fine moving stage is θB$_Z$ in the counterclockwise direction from the side surface 22 of the fine moving stage, as shown in FIG. 8. The angle θBZ between the reflection surface 21 of the X bar mirror 12 and the side surface 22 of the fine moving stage is measured in advance using an auto collimator or the like. Assume that the fine moving stage 2 is inclined at an unknown angle ωZ about the Z axis, and an angle made by X measurement light 10 and the X bar mirror 12 is θS$_Z$ in the counterclockwise direction from the X measurement light 10. At this time, the inclined angle about the Z axis of the fine moving stage 2 is ωZ=θS$_Z$−π/2−θB$_Z$. In this state, when the angle about the Z axis of the laser beam 9 is varied, and an X interferometer 7 measures the stage position, a length measurement error is generated in a length measurement value.

Letting L be a distance from the varying unit 16 to the X bar mirror 12, a length measurement error E of the laser interferometer system 4 can be approximated by:

$$E=2\times L\times\Delta\theta L1\times|\theta S_Z-\pi/2|$$

$$|\theta S_Z-\pi/2|=E/(2\times L\times\Delta\theta L1) \quad (11)$$

The length measurement error E corresponds to an amplitude of a length measurement value I of the X interferometer 7 at the frequency f. By applying frequency analysis to the length measurement value I of the X interferometer 7 using a bandpass filter, FFT, or the like, the amplitude at the frequency f can be calculated. The positive/negative sign of (θS$_Z$−π/2) can be judged from the relationship between the laser angle and length measurement error. For example, if the length measurement error E is decreased when the angle about the Z axis of the laser beam 9 is changed in the counterclockwise direction from the laser beam 9, (θS$_Z$−π/2) is positive, that is, it is a counterclockwise angle.

From equation (11), the inclined angle ωZ about the Z axis of the fine moving stage 2 is expressed by:

$$\omega_Z = \theta S_Z - (\pi/2) - \theta B_Z \quad (12)$$
$$= |E/(2\times L\times\Delta\theta L1)| - \theta B_Z$$

As described above, a detecting unit 14 can calculate |E/(2×L×ΔθL1)|−θB$_Z$ as an inclination about the Z axis of the fine moving stage 2. By changing the rotation position of the fine moving stage through an angle {−|E/(2×L×ΔθL1)|−θB$_Z$} about the Z axis, the X measurement light 10 and fine moving stage 2 can be set to be orthogonal to each other about the Z axis. An initializing unit 20 resets angle information about the Z axis of the fine moving stage 2 measured by the X interferometer 7 to zero.

At this time, since ωZ=0, the angle made by the X measurement light 10 and X bar mirror 12 is θS$_Z$=θB$_Z$+π/2. Although the X measurement light 10 and fine moving stage 2 are orthogonal to each other about the Z axis, but the X measurement light 10 and X bar mirror 12 are not orthogonal to each other, when the laser beam 9 is included at an unknown angle ±θL$_U$ upon using the stage apparatus, the length measurement error E is generated in the length measurement value I. The length measurement error can be approximated by:

$$E=2\times L\times\theta L_U\times|\theta B_Z| \quad (13)$$

When a measurement device such as an LSD (Laser Sensitive Detector) measures the inclined angle θL$_U$ of the laser beam, the detecting unit 14 can calculate the length measurement error E, thus correcting the length measurement error of the length measurement value I.

Fourth Embodiment

Figure 11:
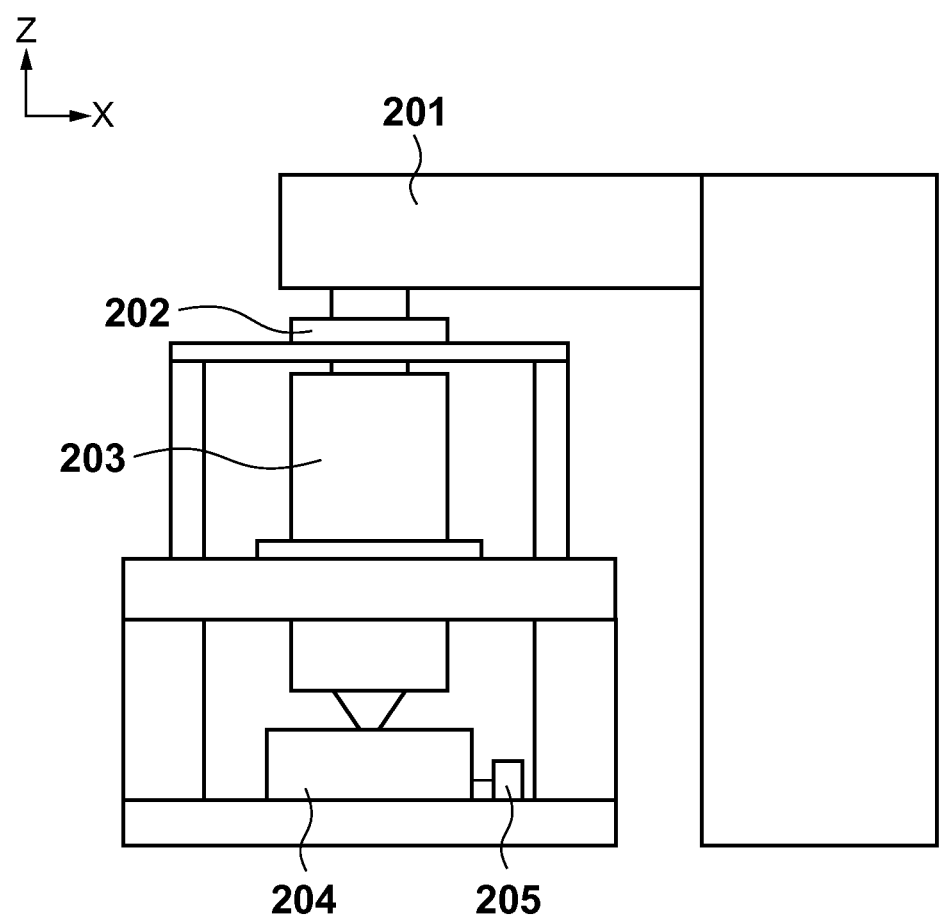
FIG. 11 is a view showing a stage apparatus according to the fourth embodiment.

An exemplary exposure apparatus to which the stage apparatus of the present invention is applied will be described below with reference to FIG. 11. The exposure apparatus includes an illumination system 201, a reticle stage 202 which holds a reticle, a projection optical system 203, a wafer stage (substrate stage) 204 which holds a wafer (substrate), and a driving unit 205 which drives the wafer stage. The stage apparatus of the present invention is applicable to one or both of the reticle stage 202 and wafer stage 204. The exposure apparatus projects and exposes a circuit pattern formed on a reticle onto a wafer, and may adopt a step-and-repeat projection exposure method or step-and-scan projection exposure method.

Fifth Embodiment

A method of manufacturing a device (semiconductor device, liquid crystal display device, or the like) according to one embodiment of the present invention will be described below. A semiconductor device is manufactured via a pre-process for forming an integrated circuit on a wafer, and a post-process for completing an integrated circuit chip formed on the wafer in the pre-process as a product. The pre-process includes a process of exposing a wafer applied with a photosensitive agent using the aforementioned stage apparatus, and a process of developing the wafer. The post-process includes an assembly process (dicing, bonding) and a packaging process (enclosure). A liquid crystal display device is manufactured via a process for forming a transparent electrode. The process for forming the transparent electrode includes a process for applying a photosensitive agent on a glass substrate on which a transparent conductive film is deposited, a process for exposing the glass substrate applied with the photosensitive agent using the aforementioned stage apparatus, and a process for developing the glass substrate. According to the device manufacturing method of the present invention, a device having higher quality than a conventional device can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-246663, filed Nov. 8, 2012, which is hereby incorporated by reference herein in its entirety.

What is claimed is:

1. A stage apparatus comprising a stage, an interferometric measurement device which is arranged to be able to measure a position of a surface of a mirror arranged on a side surface of said stage, and a driving unit configured to position the stage based on a measurement result of said interferometric measurement device,
wherein said interferometric measurement device comprises:
a varying unit configured to periodically vary an incident position where measurement light is incident on the mirror; and
a detecting unit configured to detect rotation of the mirror based on a variation amount of the measurement result of said interferometric measurement device, which is generated upon a periodic variation of the incident position.

2. The apparatus according to claim 1, wherein said driving unit positions said stage based on the detected rotation of the mirror.

3. The apparatus according to claim 1, wherein said detecting unit detects the rotation of the mirror based on an optical path length of the measurement light from the varying unit to the mirror.

4. The apparatus according to claim 1, wherein said interferometric measurement device comprises a laser light source, and an interferometer configured to split light emitted by said laser light source into reference light and measurement light, and to make measurement light reflected by the mirror and reference light reflected by a reference mirror interfere with each other, and
said varying unit is arranged between said laser light source and said interferometer.

5. The apparatus according to claim 1, wherein said varying unit periodically varies the incident position by periodically varying an angle of the measurement light.

6. The apparatus according to claim 1, wherein said varying unit periodically varies the incident position by periodically shifting the measurement light along an extending direction of the mirror.

7. The apparatus according to claim 1, wherein said varying unit periodically varies the incident position at a frequency which exceeds a control band of a position control system of said stage.

8. The apparatus according to claim 1, wherein said detecting unit determines a rotation position at which a change in periodic variation amount of the measurement result obtained by changing the rotation position of said stage falls within a threshold range, and
said driving unit positions said stage based on the determined rotation position.

9. The apparatus according to claim 8, wherein said detecting unit determines a rotation position at which a change in periodic variation amount of the measurement result obtained by changing the rotation position of said stage is minimum.

10. The apparatus according to claim 1, wherein said interferometric measurement device comprises an initializing unit configured to initialize information of a position and an orientation of said stage based on the detected rotation of the mirror.

11. The apparatus according to claim 10, wherein said initializing unit initializes the information of the position and the orientation of said stage based on the detected rotation of the mirror so that the measurement light and the mirror are orthogonal to each other.

12. The apparatus according to claim 10, wherein said initializing unit initializes the information of the position and the orientation of said stage further based on a shape of the mirror in addition to the detected rotation of the mirror.

13. An exposure apparatus for exposing a substrate by projecting a pattern formed on a reticle onto the substrate, the apparatus comprising:
a stage apparatus configured to hold at least one of the reticle and the substrate,
wherein said stage apparatus comprises a stage, an interferometric measurement device which is arranged to be able to measure a position of a surface of a mirror arranged on a side surface of the stage, and a driving unit configured to position said stage based on a measurement result of said interferometric measurement device, and
said interferometric measurement device comprises:
a varying unit configured to periodically vary an incident position where measurement light is incident on the mirror; and
a detecting unit configured to detect rotation of the mirror based on a variation amount of the measurement result of said interferometric measurement device, which is generated upon a periodic variation of the incident position.

14. A method of manufacturing a device, the method comprising:
exposing a substrate using an exposure apparatus which exposes the substrate by projecting a pattern formed on a reticle onto the substrate;

developing the exposed substrate; and processing the developed substrate to manufacture the device, wherein the exposure apparatus comprises a stage apparatus configured to hold at least one of the reticle and the substrate, the stage apparatus comprises a stage, an interferometric measurement device which is arranged to be able to measure a position of a surface of a mirror arranged on a side surface of the stage, and a driving unit configured to position the stage based on a measurement result of the interferometric measurement device, and the interferometric measurement device comprises:

a varying unit configured to periodically vary an incident position where measurement light is incident on the mirror; and a detecting unit configured to detect rotation of the mirror based on a variation amount of the measurement result of the interferometric measurement device, which is generated upon a periodic variation of the incident position.

15. A method of adjusting a stage apparatus which comprises a stage, an interferometric measurement device which is arranged to be able to measure a position of a surface of a mirror arranged on a side surface of the stage, and a driving unit configured to position the stage based on a measurement result of the interferometric measurement device, the method comprising:

periodically varying an incident position where measurement light is incident on the mirror;

detecting rotation of the mirror based on a variation amount of the measurement result of the interferometric measurement device, which is generated upon a periodic variation of the incident position; and positioning the stage using the driving unit based on the detected rotation of the mirror.

* * * * *